United States Patent [19]

Asai

[11] Patent Number: 5,369,710
[45] Date of Patent: Nov. 29, 1994

[54] SOUND FIELD CORRECTING APPARATUS AND METHOD

[75] Inventor: Sampei Asai, Tokyo, Japan

[73] Assignee: Pioneer Electronic Corporation, Tokyo, Japan

[21] Appl. No.: 29,050

[22] Filed: Mar. 9, 1993

[30] Foreign Application Priority Data

Mar. 23, 1992 [JP] Japan .................. 4-065024

[51] Int. Cl.⁵ .............................. H03G 3/00
[52] U.S. Cl. ........................................ 381/63
[58] Field of Search ........................ 381/1, 63

[56] References Cited

U.S. PATENT DOCUMENTS 4,803,731  2/1989  Niimi et al. .................. 381/63
5,195,140  3/1993  Kudo et al. .................. 381/63

*Primary Examiner*—Forester W. Isen
*Attorney, Agent, or Firm*—Sughrue, Mion, Zinn, Macpeak & Seas

[57] ABSTRACT

Sound field correcting apparatus and method, in which at least two reflected sound generating circuits are cascade connected and output signals of the reflected sound generating circuits are added. A plurality of initial reflected sound signals for an original signal are first generated. Further many reflected sound signals are subsequently generated for the plurality of initial reflected sound signals. Those many reflected sound signals are obtained as reverberation sound portions.

6 Claims, 5 Drawing Sheets

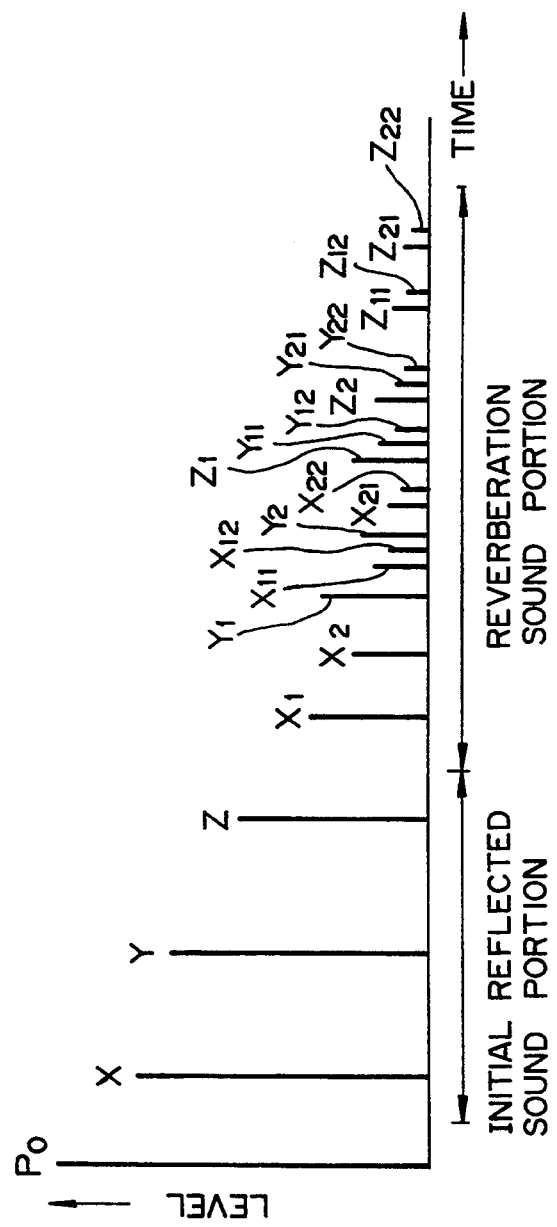

SOUND FIELD CORRECTING APPARATUS AND METHOD

BACKGROUND OF THE INVENTION

1. Field of the Invention

The present invention relates to sound field correcting apparatus and method for falsely producing a good acoustic space by adding reflected sounds and reverberation sounds to an original signal sound.

2. Description of the Related Background Art

When the reverberation characteristics in the acoustic space of a concert hall or the like are shown by an impulse response, they are as shown in, for instance, FIG. 1. Although the impulse response changes in dependence on the environment of the acoustic space, it can be separated to the initial reflected sound portion and the following reverberation sound portion on the basis of the level and density. The initial reflected sounds are called elements to determine a spatial image such as a feeling of extent in the room of a concert hall or the like and have high levels. As for the reverberation sounds subsequent to the initial reflected sounds, the density increases in proportion to the square of the time and the sounds are repetitively reflected by the wall surfaces in the room, so that there is a tendency such that the high frequency components decrease.

There is a sound field correcting apparatus, on the other hand, to falsely produce an acoustic space like a concert hall at home or in the room of a vehicle by adding the reflected sounds and reverberation sounds to the original signal sound. In the conventional sound field correcting apparatus, a delay circuit group 1 which is constructed by serially connecting a plurality of delay circuits as shown in FIG. 2 is provided. An input digital audio signal is supplied to the first delay circuit of the delay circuit group 1. The audio signal delayed by the delay circuit group 1 is supplied to a coefficient multiplier group 2. The coefficient multiplier group 2 multiplies a coefficient to the delayed audio signal by each coefficient multiplier and supplies signals indicative of the results of the multiplications to an adder 3. A signal indicative of the result of the addition of the adder 3 is further supplied as a reflected sound signal to an adder 5 through a coefficient multiplier 4. The input digital audio signal as an original signal is supplied to the adder 5 through a coefficient multiplier 6, so that a reflected sound signal is added to the original signal and the resultant addition signal is generated from the adder 5 as an output signal.

FIG. 3 shows impulse response characteristics in case of using such a conventional sound field correcting apparatus. When comparing this impulse response characteristics with the impulse response in the actual acoustic space shown in FIG. 1, the characteristics in both of the initial reflected sound portions are almost equal. In the reverberation sound portion, however, the density in case of using the sound field correcting apparatus is lean. This is because such a lean density state occurs since there are limitations of the numbers of stages of the delay circuits and the coefficient multipliers. Since the density is lean, there are problems such that the lingering tone of the sound doesn't smoothly decrease in terms of the sense of hearing and what is called a feeling of extent which is sensed in, for example, a concert hall is not obtained and a feeling of physical disorder is sensed.

To raise the density of the reverberation sounds, on the other hand, for example, the use of a recursive type filter represented by a comb filter is considered. In this case, however, since an extremely large number of arithmetic operations are repeated, the signal is deteriorated and an adverse influence is, consequently, exerted on the sound quality. In case of using the recursive type filter, there is a drawback such that a limit cycle in which the output signal does not become 0 although the input signal is set to 0 occurs.

SUMMARY OF THE INVENTION

It is, therefore, an object of the present invention to provide sound field correcting apparatus and method which can sufficiently obtain a feeling of extent which is wider than that in the conventional apparatus.

A sound field correcting apparatus of the present invention comprises: at least two reflected sound generating circuits each of which is constructed by a plurality of cascade connected delay circuits, a plurality of coefficient multipliers which are respectively connected to outputs of the plurality of delay circuits, and an adder for adding output signals of the plurality of coefficient multipliers and for generating an addition signal; connecting means for cascade connecting the reflected sound generating circuits; and adding means for adding output signals of the reflected sound generating circuits.

According to the sound field correcting apparatus of the present invention, by cascade connecting a plurality of reflected sound generating circuits, a plurality of initial reflected sound signals for an original signal are generated and further many reflected sound signals are generated for the plurality of initial reflected sound signals and are obtained as reverberation sound signals.

A sound field correcting method of the present invention comprises the steps of: generating a plurality of initial reflected sound signals by a first reflected sound generating circuit including a plurality of delay circuits which are cascade connected to input terminals to which an input signal is supplied; generating a plurality of reflected sound signals for the plurality of initial reflected sound signals by a second reflected sound generating circuit including a plurality of delay circuits which are cascade connected to an output of the first reflected sound generating circuit; and adding output signals of the first and second reflected sound generating circuits.

BRIEF DESCRIPTION OF THE DRAWINGS

FIG. 6 is a diagram showing an impulse response of the apparatus of FIG. 5.

DETAILED DESCRIPTION OF A PREFERRED EMBODIMENT

An embodiment of the present invention will be described in detail hereinbelow with reference to the drawings.

Figure 1:
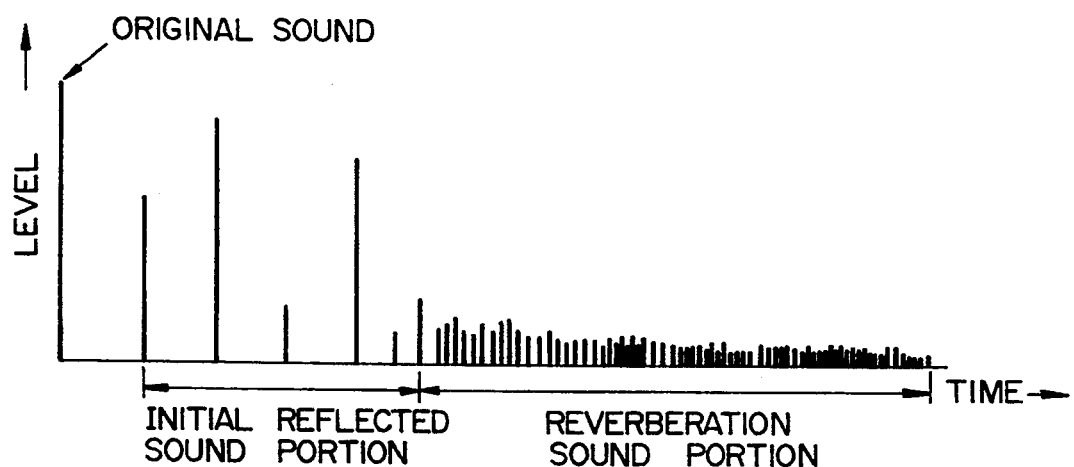
FIG. 1 is a diagram showing an impulse response in an actual acoustic space.
Figure 2:
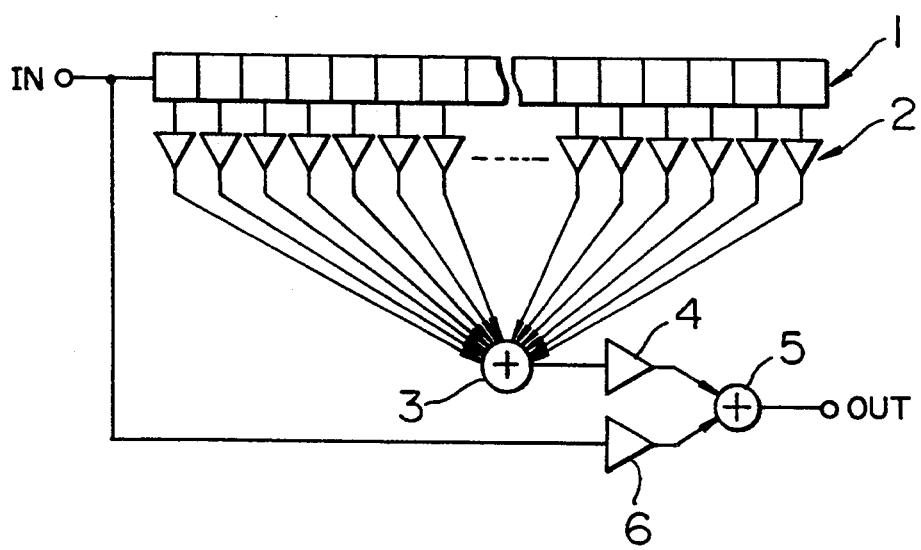
FIG. 2 is a block diagram showing a conventional sound field correcting apparatus.
Figure 3:
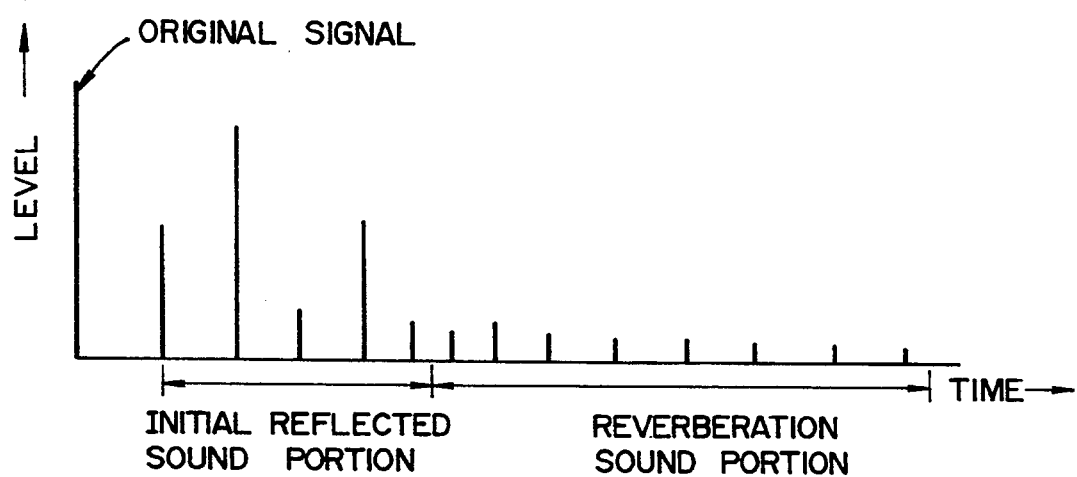
FIG. 3 is a diagram showing an impulse response of the apparatus of FIG. 2.
Figure 4:
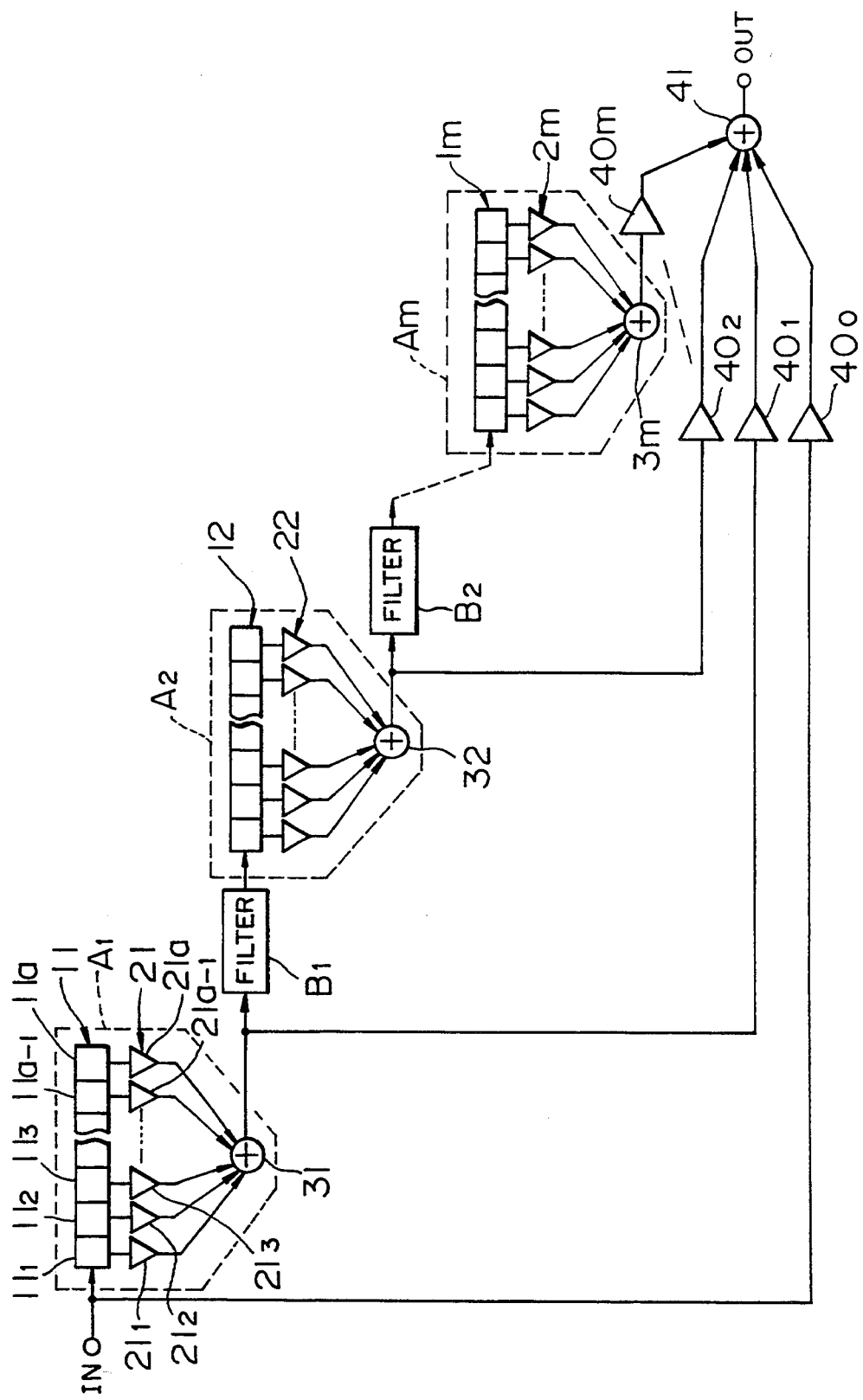
FIG. 4 is a block diagram showing an embodiment of the present invention.

FIG. 4 shows a sound field correcting apparatus according to the present invention. The apparatus has a delay circuit group 11 to which an input digital audio signal is supplied through an input terminal IN. The delay circuit group 11 is constructed by serially connecting a plurality of delay circuits $11_1$ to $11_a$ (a is an integer of 2 or more). A coefficient multiplier group 21 comprising coefficient multipliers $21_1$ to $21_a$ of the number as many as only the number of delay circuits of the delay circuit group 11 is connected to delay outputs of the delay circuit group 11. An adder 31 is connected to outputs of the coefficient multipliers $21_1$ to $21_a$. The adder 31 adds output signals of the coefficient multipliers $21_1$ to $21_a$. A circuit comprising the delay circuit group 11, coefficient multiplier group 21, and adder 31 assumes a reflected sound generating circuit $A_1$. A reflected sound generating circuit $A_2$ is connected through a filter $B_1$ to an output of the adder 31 as an output signal of the reflected sound generating circuit $A_1$. The filter $B_1$ is a band limiting filter such as band pass filter and low pass filter and is constructed by, for instance, a digital filter of an IIR (Infinite Impulse Response) type. It is desirable that the IIR type filter has a large number of bits. A filter and a reflected sound generating circuit are repetitively connected to an output of the reflected sound generating circuit $A_2$ up to a filter $B_{m-1}$ (m is an integer of 2 or more) and a reflected sound generating circuit $A_m$. Each of the reflected sound generating circuits $A_2$ to $A_m$ is also constructed by a delay circuit group, a coefficient multiplier group, and an adder in a manner similar to the reflected sound generating circuit $A_1$. The numbers of stages of the delay circuits and the coefficient multipliers of each of the reflected sound generating circuits $A_1$ to $A_m$ are not the same. A delay time of each delay circuit and a coefficient of each coefficient multiplier are also not set to the same values. Each delay time is set to a value which is sufficiently larger than a sampling interval of the input digital audio signal.

Coefficient multipliers $40_0$ to $40_m$ are connected to the input terminal IN and outputs of the reflected sound generating circuits $A_1$ to $A_m$. Output signals of the coefficient multipliers $40_0$ to $40_m$ are supplied to an adder 41. An output of the adder 41 is connected to an output terminal OUT.

In the above construction, the reflected sound signal produced by the reflected sound generating circuit $A_1$ for the input digital audio signal is further supplied to the reflected sound generating circuit $A_2$, so that a reflected sound signal corresponding to the reflected sound signal supplied is generated. In the reflected sound generating circuits $A_2$ to $A_m$, therefore, the generation of the reflected sound signal for the input reflected sound signal is repeated. By repeating the generation of the reflected sound signal, elements as reverberation sound signal such that the density of the reflected sound components in the signal rises are included.

Filters $B_1$ to $B_{m-1}$ are provided to attenuate the high frequency components in the output signals of the reflected sound generating circuits $A_l$ to $A_{m-1}$ in consideration of a fact that the high frequency components decrease each time the sound is reflected in the actual sound field. Now, assuming that all of the filters $B_1$ to $B_{m-1}$ are low pass filters, there are relations of $f_1 > f_2 > - - > f_{m-1}$ among cut-off frequencies $f_1$ to $f_{m-1}$.

Figure 5:
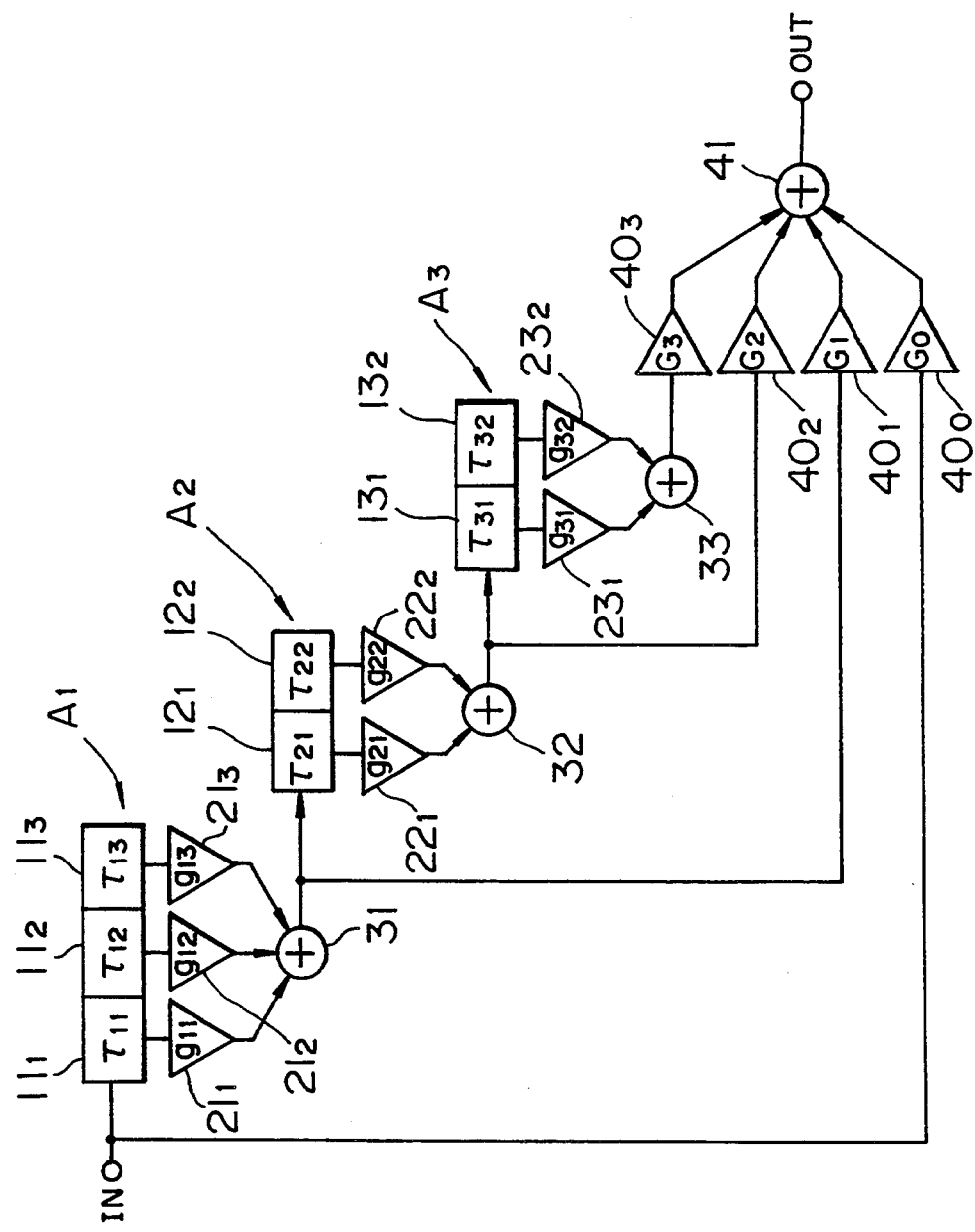
FIG. 5 is a simplified block diagram for explaining the operation of an apparatus of the present invention.

FIG. 5 shows a construction having three reflected sound generating circuits $A_1$ to $A_3$ in order to easily explain the operation of the sound field correcting apparatus according to the present invention shown in FIG. 4. The filters $B_1$ and $B_2$ are omitted here. The reflected sound generation circuit $A_1$ comprises three delay circuits $11_1$ to $11_3$, three coefficient multipliers $21_1$ to $21_3$, and one adder 31. The reflected sound generating circuit $A_2$ comprises two delay circuits $12_1$ and $12_2$, two coefficient multipliers $22_1$ and $22_2$, and one adder 32. The reflected sound generating circuit $A_3$ comprises two delay circuits $13_1$ and $13_2$, two coefficient multipliers $23_1$ and $23_2$, and one adder 33. It is now assumed that delay times of the delay circuits $11_1$ to $11_3$ are set to $\tau_{11}$ to $\tau_{13}$, delay times of the delay circuits $12_1$ and $12_2$ are set to $\tau_{21}$ and $\tau_{22}$, delay times of the delay circuits $13_1$ and $13_2$ are set to $\tau_{31}$ to $\tau_{32}$, coefficients of the coefficient multipliers $21_1$ to $21_3$ are set to $g_{11}$ to $g_{13}$, coefficients of the coefficient multipliers $22_1$ and $22_2$ are set to $g_{21}$ and $g_{22}$, coefficients of the coefficient multipliers $23_1$ and $23_2$ are set to $g_{31}$ and $g_{32}$, and coefficients of the coefficient multipliers $40_0$ to $40_3$ are set to $G_0$ to $G_3$, respectively. The above delay times and the coefficients are set to, for instance, the following values.

$\tau_{11}=3$ msec, $\tau_{12}=4$ msec, $\tau_{13}=4.5$ msec, $\tau_{21}=12$ msec,
$\tau_{22}=2$ msec, $\tau_{31}=5$ msec, $\tau_{32}=0.5$ msec, $g_{11}=0.8$,
$g_{12}=0.7$, $g_{13}=0.5$, $g_{21}=0.8$, $g_{22}=0.5$, $g_{31}=0.8$,
$g_{32}=0.5$, $G_0=1.0$, $G_1=1.0$, $G_2=0.5$, $G_3=0.3$ As shown in FIG. 6, now assuming that an impulse $P_0$ was supplied to the input terminal IN, the impulse $P_0$ is immediately generated from the output terminal OUT through the coefficient multiplier $40_0$ and adder 41. The impulse $P_0$ is delayed by only the time $\tau_{11}$ by the delay circuit 11. After that, the delayed impulse is multiplied by to the coefficient $g_{11}$ by the coefficient multiplier $21_1$. The signal $P_0 \times g_{11}$ passes through the adder 31 and is further multiplied to the coefficient $G_1$ by the coefficient multiplier $40_1$ and, after that, the multiplied signal is generated from the adder 41. Due to this, an impulse response $X (=P_0 \times g_{11} \times G_1)$ is obtained after the elapse of the time $\tau_{11}$ from the input timing of the impulse $P_0$. The impulse $P_0$ delayed by the delay circuit $11_1$ is further delayed by only the time $\tau_{12}$ by the delay circuit $11_2$. After that, the delayed impulse is multiplied to the coefficient $g_{12}$ by the coefficient multiplier $21_2$. The signal $P_0 \times g_{12}$ passes through the adder 31 and is further multiplied to the coefficient $G_1$ by the coefficient multiplier $40_1$. After that, the multiplied signal is generated from the adder 41. An impulse response $Y (=P_0'g_{12} \times G_1)$ is, consequently, derived after the elapse of the time $\tau_{11}+\tau_{12}$ from the input timing of the impulse $P_0$. Similarly, an impulse response $Z (=P_0 \times g_{13} \times G_1)$ is derived after the elapse of the time $\tau_{11}+\tau_{12}+\tau_{13}$ from the input timing of the impulse $P_0$. The impulse responses X, Y, and Z become the initial reflected sounds.

The initial reflected sound component of the impulse $P_0$ which is supplied from the adder 31 is delayed by only the time $\tau_{21}$ by the delay circuit $12_1$. After that, the delayed signal is multiplied to the coefficient $g_{21}$ by the coefficient multiplier $22_1$. The multiplied signal further passes through the adder 32 and is multiplied to the coefficient $G_2$ by the coefficient multiplier $40_2$. The signal component delayed by the delay circuit $12_1$ is delayed by only the time $\tau_{22}$ by the delay circuit $12_2$. After that, the delayed signal is multiplied to the coefficient $g_{22}$ by the coefficient multiplier $22_2$. The multiplied signal further passes through the adder 32 and is multiplied to the coefficient $G_2$ by the coefficient multiplier $40_2$. Impulse responses $X_1 (=P_0 \times g_{11} \times g_{21} \times G_2)$ and $X_2$ ($=P_0 \times g_{11} \times g_{22} \times G_2$) are, therefore, generated after the elapse of the times $\tau_{21}$ and $\tau_{21}+\tau_{22}$ from the generation timing of the impulse response X. Impulse responses $Y_1$ ($=P_0 \times g_{12} \times g_{21} \times G_2$) and $Y_2$ ($=P_0 \times g_{12} \times g_{22} \times G_2$) are generated after the elapse of times $\tau_{21}$ and $\tau_{21}+\tau_{22}$ from the generation timing of the impulse response Y. Impulse responses $Z_1$ ($=P_0 \times g_{13} \times g_{21} \times G_2$) and $Z_2$ ($=P_0 \times g_{13} \times g_{22} \times G_2$) are generated after the elapse of times $\tau_{21}$ and $\tau_{21}+\tau_{22}$ from the generation timing of the impulse response Z.

The signal component which is supplied from the adder 32 is delayed by only the time $\tau_{31}$ by the delay circuit $13_1$ and, after that, the delayed signal is multiplied to the coefficient $g_{31}$ by the coefficient multiplier $23_1$. Further, the multiplied signal passes through the adder 33 and is multiplied to the coefficient $G_3$ by the coefficient multiplier $40_3$. The signal component delayed by the delay circuit $13_1$ is delayed by only the time $\tau_{32}$ by the delay circuit $13_2$. After that, the delayed signal is multiplied to the coefficient $g_{32}$ by the coefficient multiplier $23_2$. Further, the multiplied signal passes through the adder 33 and is multiplied to the coefficient $G_3$ by the coefficient multiplier $40_3$.

Impulse responses $X_{11}$ ($=P_0 \times g_{11} \times g_{21} \times g_{32} \times G_3$) are, consequently, generated after the elapse of times $\tau_{31}$ and $\tau_{31}+\tau_{32}$ from the generation timing of the impulse response $X_1$. Impulse responses $X_{21}$ ($=P_0 \times g_{22} \times g_{31} \times G_3$) and $X_{22}$ ($=P_0 \times g_{11} \times g_{22} \times g_{32} \times G_3$) are generated after the elapse of times $\tau_{31}$ and $\tau_{31}+\tau_{32}$ from the generation timing of the impulse response $X_2$. Similarly, impulse responses $Y_{11}$, $Y_{12}$, $Y_{21}$, $Y_{22}$, $Z_{11}$, $Z_{12}$, $Z_{21}$, and $Z_{22}$ are generated. Due to this, twenty-one impulse responses are generated for the impulse $P_0$ as shown in FIG. 6. Among them, the impulse responses $X_1$, $X_2$, $Y_1$, $Y_2$, $Z_1$, $Z_2$, $X_{11}$, $X_{12}$, $X_{21}$, $X_{22}$, $Y_{11}$, $Y_{12}$ $Y_{21}$, $Y_{22}$, $Z_{11}$, $Z_{12}$, $Z_{21}$, and $Z_{22}$ become reverberation sounds and the density is higher than that of the initial reflected sound portion.

It is sufficient to provide at least two stages of the initial reflected sound generating stage and the reverberation sound generating stage as reflected sound generating circuits. As an example of an actual design in case of using two stages of the reflected sound generation circuits, the numbers of delay circuits and coefficient multipliers in the reflected sound generating circuit of the initial reflected sound generating stage can be set to, for instance, 23, while the numbers of delay circuits and coefficient multipliers in the reflected sound generating circuit in the reverberation sound generating stage can be set to, for example, 21. The delay time of each delay circuit of the initial reflected sound generating stage is set to a value within a range from a few msec to 10 msec and the total delay time is set to about 150 msec. A delay time of each delay circuit of the reverberation sound generating stage is also set to a value within a range from a few msec to 10 msec and the total delay time is set to about 500 msec. A band pass filter in a frequency range from 100 Hz to 8 kHz can be used as a filter between the initial reflected sound generating stage and the reverberation sound generating stage.

It is sufficient to set $\tau$, g, and G in a manner such that the envelope of the impulse response characteristics exponentially decreases as a whole and the level and time interval of each impulse response become random to a certain extent and, further, a probability of the occurrence of impulses increases in proportion to the square of the time. On the other hand, it is necessary to set the delay time $\tau$ so that the responses don't overlap as possible.

The coefficient multipliers $40_0$ to $40_m$ included in the adding means together with the adder 41, further, set the levels of the original sound, initial reflected sound, and reverberation sound. That is, the levels can be relatively set by the coefficient multipliers $40_0$ to $40_m$ without changing the coefficients of the coefficient multipliers of the coefficient multiplier groups 21 to $2m$. It is, therefore, convenient to change the characteristics in correspondence to a sound environment.

The construction in the above embodiment can be also accomplished by use of a DSP (Digital Signal Processor).

In the embodiment, further, although the filters $B_1$ to $B_{m-1}$ are provided on the input sides of the reflected sound generating circuits $A_2$ to $A_m$, respectively, those filters can be also provided on the output sides of the reflected sound generating circuits $A_2$ to $A_m$.

According to the present invention, at least two reflected sound generating circuits are cascade connected and the output signals of the reflected sound generating circuits are added. Due to this, a plurality of initial reflected sound signals for the original signal are first generated, further many reflected sound signals are given to a plurality of initial reflecting sound signals and such many reflected sound signals can be obtained as the reverberation sound portions. Since the density is high in the reverberation sound portion, therefore, a natural sense of hearing such that the lingering tone of the sound smoothly decreases is obtained and a feeling of extent which is sufficiently wider than that of the conventional apparatus can be obtained. The signal deterioration occurring in case of using a recursive type filter hardly occurs. No limit cycle occurs.

What is claimed is:

1. A sound field correcting apparatus comprising:
   at least two reflected sound generated circuits each of which is constructed by a plurality of delay circuits which are cascade connected, a plurality of coefficient multipliers connected to respective outputs of said plurality of delay circuits, and an adder for adding output signals of said plurality of coefficient multipliers and for generating an added signal;
   connecting means for cascade connecting said reflected sound generating circuits such that the added signal generated by one of said reflected sound generating circuits serves as an input signal for a succeeding one of said reflected sound generating circuits in the cascade; and
   adding means for adding output signals of said reflected sound generating circuits.

2. An apparatus according to claim 1, wherein the reflected sound generating circuit at the post stage among at least said two reflected sound generating circuits includes a filter on the input side or output side.

3. An apparatus according to claim 2, wherein said filter is a band pass filter or a low pass filter.

4. A sound field correcting method comprising the steps of:
   generating a first plurality of initial reflected sound signals by using a plurality of delay circuits which are cascade connected to a first input terminal to which an input signal is supplied;
   adding said plurality of initial reflected sound signals to form a first added signal;
   generating a second plurality of reflected sound signals of said first plurality of initial reflected sound signals by using a plurality of delay circuits which are cascade connected to a second input terminal to which the first added signal is supplied;

adding said second plurality of reflected sound signals to form a second added signal; and adding said first and second added signals.

5. A method according to claim 4, wherein said method further comprises the step of cutting off high frequency components of said first added signal before supplying said first added signal to said second input terminal.

6. A method according to claim 4, wherein said method further comprises the step of cutting off high frequency components of said second added signal before adding said second added signal to said first added signal.

* * * * *